United States Patent
Lee et al.

(10) Patent No.: US 10,566,997 B2
(45) Date of Patent: Feb. 18, 2020

(54) APPARATUS AND METHOD FOR DATA COMPRESSION AND DECOMPRESSION BASED ON CALCULATION OF ERROR VECTOR MAGNITUDE

(71) Applicant: Electronics and Telecommunications Research Institute, Daejeon (KR)

(72) Inventors: Je-Won Lee, Daejeon (KR); Eun-Hee Hyun, Daejeon (KR); Heung-Mook Kim, Daejeon (KR); Joon-Young Jung, Daejeon (KR)

(73) Assignee: Electronics and Telecommunications Research Institute, Daejeon (KR)

(*) Notice: Subject to any disclaimer, the term of this patent is extended or adjusted under 35 U.S.C. 154(b) by 0 days.

(21) Appl. No.: 16/158,375

(22) Filed: Oct. 12, 2018

(65) Prior Publication Data

US 2019/0173490 A1   Jun. 6, 2019

(30) Foreign Application Priority Data

Dec. 5, 2017   (KR) .................. 10-2017-0166154

(51) Int. Cl.
*H03M 7/40* (2006.01)
*H03M 7/30* (2006.01)

(52) U.S. Cl.
CPC .......... *H03M 7/6047* (2013.01); *H03M 7/30* (2013.01); *H03M 7/3062* (2013.01); *H03M 7/3066* (2013.01); *H03M 7/40* (2013.01)

(58) Field of Classification Search
CPC .... H03M 7/6047; H03M 7/40; H03M 7/3062; H03M 7/00; H03M 5/00; H03M 7/4031

USPC .............................................. 341/50, 51, 67
See application file for complete search history.

(56) References Cited

U.S. PATENT DOCUMENTS

| | | | | |
|---|---|---|---|---|
| 6,647,129 B2* | 11/2003 | Rhoads | ............... | G06F 12/1408 348/461 |
| 8,842,724 B1* | 9/2014 | Joung | .................. | H03M 7/3062 375/240 |
| 9,276,605 B2 | 3/2016 | Xia et al. | | |
| 9,698,817 B2 | 7/2017 | Kim | | |
| 2002/0061066 A1* | 5/2002 | Persiantsev | .......... | H04N 19/503 375/240.19 |
| 2006/0109984 A1* | 5/2006 | Rhoads | ............... | G06Q 20/1235 380/252 |
| 2016/0353109 A1* | 12/2016 | Berry | ..................... | H04N 19/93 |

FOREIGN PATENT DOCUMENTS

| KR | 10-1410249 B1 | 6/2014 |
|---|---|---|
| KR | 10-2016-0092857 A | 8/2016 |

\* cited by examiner

*Primary Examiner* — Jean B Jeanglaude
(74) *Attorney, Agent, or Firm* — NSIP Law

(57) ABSTRACT

A data compression apparatus includes a lossy compression unit for calculating, in advance, a reference error vector magnitude depending on lossy compression and decompression by removing lower bits from a data signal composed of bitstreams, for setting removal target lower bits satisfying a preset error vector magnitude requirement, and for lossily compressing the data signal by removing the removal target lower bits from the data signal, and a communication unit for transmitting the compressed data signal to a data decompression apparatus.

20 Claims, 13 Drawing Sheets

APPARATUS AND METHOD FOR DATA COMPRESSION AND DECOMPRESSION BASED ON CALCULATION OF ERROR VECTOR MAGNITUDE

CROSS REFERENCE TO RELATED APPLICATION

This application claims the benefit of Korean Patent Application No. 10-2017-0166154, filed Dec. 5, 2017, which is hereby incorporated by reference in its entirety into this application.

BACKGROUND OF THE INVENTION

1. Technical Field

The present invention relates to an apparatus and method for data compression and decompression based on the calculation of an Error Vector Magnitude (EVM) to reduce the amount of data that is transmitted and received in a data transmission/reception section.

2. Description of the Related Art

According to conventional technology, In-phase/Quadrature (I/Q) data compression methods may be divided into two methods, namely a method for processing individual samples and a method for grouping certain samples into respective blocks and processing the blocks. The I/Q data compression method for processing individual samples is advantageous in that a delay time for processing does not occur, but it is problematic in that additional bits are used for each sample when compression is performed using additional bits, thus deteriorating compression efficiency. On the other hand, the I/Q data compression method for grouping samples into respective blocks and processing the blocks is advantageous in that the number of additional bits used for each sample is reduced because additional bits are used for each block, but it is problematic in that the delay time for processing is increased in proportion to the increased number of samples per block.

The conventional technology has utilized a lossless I/Q data compression method, such as source coding, to additionally obtain compressibility after lossy I/Q data compression has been performed. However, lossless I/Q data compression according to this method is problematic in that processing complexity is identical to that when only the lossless compression method is used, but efficiency is further decreased.

The above-described background technology is technological information that was possessed by the present applicant to devise the present invention or that was acquired by the present applicant during the procedure for devising the present invention, and thus such information cannot be construed to be known technology that was open to the public before the filing of the present invention.

PRIOR ART DOCUMENTS

Patent Documents (Patent Document 1) Korean Patent No. 10-1410249

SUMMARY OF THE INVENTION

Accordingly, the present invention has been made keeping in mind the above problems occurring in the prior art, and an object of the present invention is to provide an apparatus and method for data compression and decompression, which calculate a minimized error vector magnitude using data distribution characteristics, perform data compression satisfying a given error vector magnitude requirement, and perform data decompression based on a lossy decompression method for minimizing an error vector magnitude using the data distribution characteristics.

Another object of the present invention is to provide an apparatus and method for additionally performing lossless compression and decompression on some upper bits using the characteristic in which the same bit is repeated in the upper bits of data.

In accordance with an aspect of the present invention to accomplish the above objects, there is provided a data compression apparatus, including a lossy compression unit for calculating, in advance, a reference error vector magnitude depending on lossy compression and decompression by removing lower bits from a data signal composed of bitstreams, for setting removal target lower bits satisfying a preset error vector magnitude requirement, and for lossily compressing the data signal by removing the removal target lower bits from the data signal; and a communication unit for transmitting the compressed data signal to a data decompression apparatus.

The reference error vector magnitude may be an error vector magnitude calculated based on recovery target lower bits corresponding to the removal target lower bits that minimize the error vector magnitude using one or more of distribution characteristics of the data signal and distribution characteristics of the removal target lower bits.

The recovery target lower bits may be set by assuming that the removal target lower bits are uniformly distributed.

The recovery target lower bits may be set such that a Most Significant Bit (MSB) is populated with 1 and remaining bits are populated with 0.

The data compression apparatus may further include a lossless compression unit for setting target upper bits for lossless compression, among bits of the data signal, and losslessly compressing the target upper bits for lossless compression, wherein the communication unit may transmit the data signal compressed through the lossy compression unit and the lossless compression unit to the data decompression apparatus.

The lossless compression unit may losslessly compress the target upper bits for lossless compression based on Huffman coding that causes a shorter bitstream to match a bitstream in which an identical bit from an MSB is more frequently repeated.

The lossless compression unit may set a number of bits corresponding to the target upper bits for lossless compression in consideration of power of the data signal.

In accordance with an aspect of the present invention to accomplish the above objects, there is provided a data decompression apparatus, including a communication unit data for receiving a compressed data signal from a data compression apparatus; and a lossy decompression unit for setting recovery target lower bits corresponding to removal target lower bits that minimize an error vector magnitude using one or more of distribution characteristics of a data signal corresponding to the compressed data signal and distribution characteristics of removal target lower bits corresponding to the compressed data signal, and lossily decompressing the compressed data signal using the set recovery target lower bits.

The recovery target lower bits may be set by assuming that the removal target lower bits are uniformly distributed.

The recovery target lower bits may be set such that a Most Significant Bit (MSB) is populated with 1 and remaining bits are populated with 0.

The data decompression apparatus may further include a lossless decompression unit for losslessly decompressing target upper bits for lossless compression, which have been losslessly compressed, using a number of bits corresponding to the target upper bits for lossless compression, among upper bits of the compressed data signal.

The lossless decompression unit may perform lossless decompression based on Huffman coding that causes a shorter bitstream to match a bitstream in which an identical bit from an MSB is more frequently repeated.

The number of bits corresponding to the target upper bits for lossless compression may be set based on power of the data signal.

In accordance with a further aspect of the present invention to accomplish the above objects, there is provided a data compression method, including calculating, in advance, a reference error vector magnitude depending on lossy compression and decompression by removing lower bits from a data signal composed of bitstreams; setting removal target lower bits satisfying a preset error vector magnitude requirement; lossily compressing the data signal by removing the removal target lower bits from the data signal; and transmitting the compressed data signal to a data decompression apparatus.

The reference error vector magnitude may be an error vector magnitude calculated based on recovery target lower bits corresponding to the removal target lower bits that minimize the error vector magnitude using one or more of distribution characteristics of the data signal and distribution characteristics of the removal target lower bits.

The recovery target lower bits may be set by assuming that the removal target lower bits are uniformly distributed.

The recovery target lower bits may be set such that a Most Significant Bit (MSB) is populated with 1 and remaining bits are populated with 0.

The data compression method may further include setting target upper bits for lossless compression, among bits of the data signal; and losslessly compressing the target upper bits for lossless compression, wherein transmitting the compressed data signal to the data decompression apparatus may be configured to transmit the data signal compressed through lossy compression and lossless compression to the data decompression apparatus.

Losslessly compressing may be configured to losslessly compress the target upper bits for lossless compression based on Huffman coding that causes a shorter bitstream to match a bitstream in which an identical bit from an MSB is more frequently repeated.

Setting the target upper bits for lossless compression may be configured to set a number of bits corresponding to the target upper bits for lossless compression in consideration of power of the data signal.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
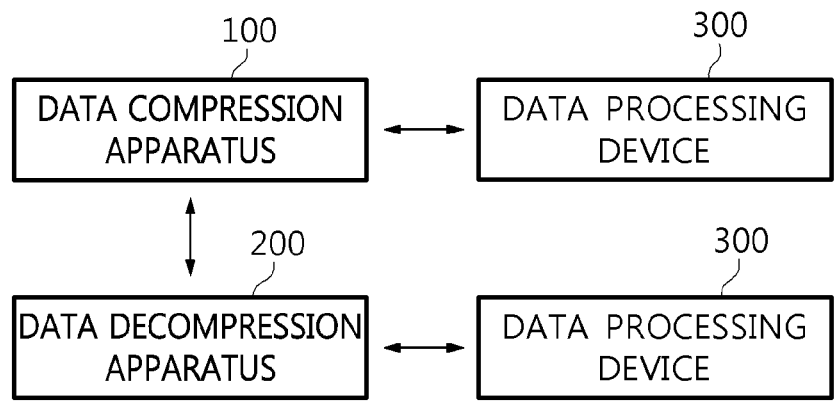
FIG. 1 is a diagram illustrating the configuration of a data compression and decompression system according to an embodiment of the present invention.

The present invention may be variously changed and may have various embodiments, and specific embodiments will be described in detail below with reference to the attached drawings. The advantages and features of the present invention and methods for achieving them will be more clearly understood from the following detailed description taken in conjunction with the accompanying drawings. Repeated descriptions and descriptions of known functions and configurations which have been deemed to make the gist of the present invention unnecessarily obscure will be omitted below. The embodiments of the present invention are intended to fully describe the present invention to a person having ordinary knowledge in the art to which the present invention pertains. Accordingly, the shapes, sizes, etc. of components in the drawings may be exaggerated to make the description clearer.

However, the present invention is not limited to the following embodiments, but some or all of the following embodiments can be selectively combined and configured, so that various modifications are possible. In the following embodiments, terms such as "first" and "second" are not intended to restrict the meanings of components, and are merely intended to distinguish one component from other components. A singular expression includes a plural expression unless a description to the contrary is specifically pointed out in context. In the present specification, it should be understood that terms such as "include" or "have" are merely intended to indicate that features or components described in the present specification are present, and are not intended to exclude the possibility that one or more other features or components will be present or added.

Embodiments of the present invention will be described in detail with reference to the accompanying drawings. In the following description of the present invention, the same reference numerals are used to designate the same or similar elements throughout the drawings, and repeated descriptions of the same components will be omitted.

FIG. 1 is a diagram illustrating the configuration of a data compression and decompression system 1 according to an embodiment of the present invention.

Referring to FIG. 1, in the data compression and decompression system 1 according to the embodiment of the present invention, a data compression apparatus 100 is connected to a data decompression apparatus 200 and to a data processing device 300, and the data decompression apparatus 200 is connected to the data compression apparatus 100 and to the data processing device 300.

The data compression apparatus 100 according to an embodiment of the present invention receives compression target data from the data processing device 300, performs lossy compression on the received data based on the calculation of an error vector magnitude in which the distribution characteristics of data signals are taken into consideration, and transmits compressed data to the data decompression apparatus 200.

Here, the data compression apparatus 100 may additionally perform lossless compression on the received data.

Here, the data compression apparatus 100 may be an apparatus that is located at a data-transmitting end in a data transmission/reception section and is configured to compress transmission target data.

The data decompression apparatus 200 receives the compressed data from the data compression apparatus 100, determines a lossy decompression method for minimizing an error vector magnitude for the received compressed data in consideration of the distribution characteristics of data signals, and performs lossy decompression on the compressed data based on the determined lossy decompression method. Here, decompressed data may be transmitted to the data processing device 300.

Also, the data decompression apparatus 200 may additionally perform lossless decompression on the received compressed data.

Here, the data decompression apparatus 200 may be an apparatus that is located at a data-receiving end in the data transmission/reception section and is configured to decompress the received data.

The data processing device 300 may be a device for generating data or processing operations on data.

For example, the data processing device 300 may include a Personal Computer (PC), a mobile terminal, a set-top box, or the like.

That is, the present invention is intended to effectively reduce the amount of data to be transferred when transmitting and receiving data signals. For this operation, a minimized error vector magnitude is calculated in consideration of the distribution of data signals so that the loss of data can be minimized during the compression and decompression of data. Further, removal target lower bits, which can satisfy a given error vector magnitude requirement, are set using information about the calculated error vector magnitude, and then lossy compression is performed based on the removal target lower bits. Accordingly, before lossy compression is performed, the error vector magnitude of data signals may be calculated, and the extent of lossy compression may be determined in conformity with the given error vector magnitude requirement, thus enabling data to be effectively compressed and decompressed.

Figure 2:
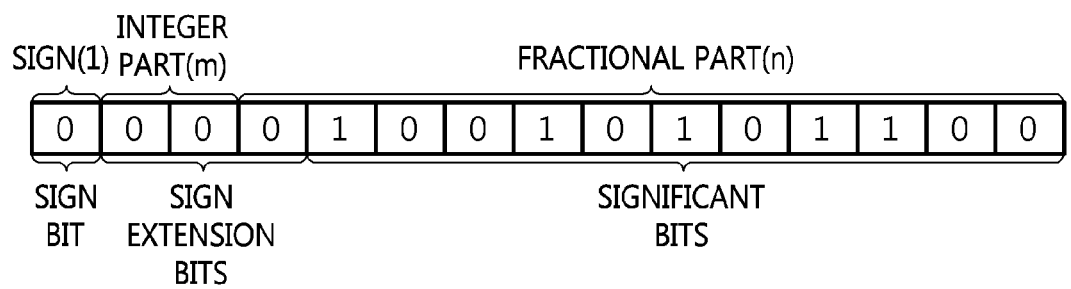
FIG. 2 is a diagram illustrating an example of target data to be transmitted.

FIG. 2 is a diagram illustrating an example of transmission target data.

Referring to FIG. 2, fixed-point data may be represented by a sign bit of 1 bit, an integer part of m bits, and a fractional (decimal) part of n bits, and may be represented by Q(m, n). Further, the data may also be represented by a sign bit, sign extension bits, and significant bits.

Here, the transmission target data may include I/Q data.

Figure 3:
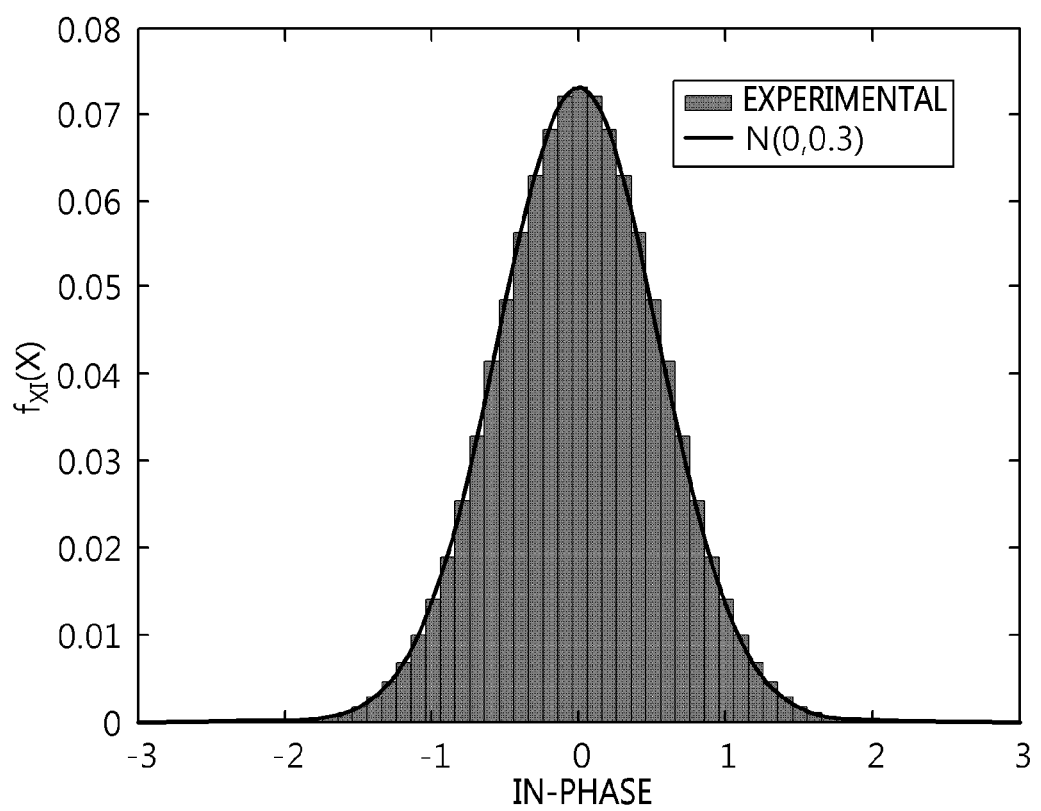
FIGS. 3 and 4 are diagrams illustrating examples of the distribution of an I/Q data signal.
Figure 4:
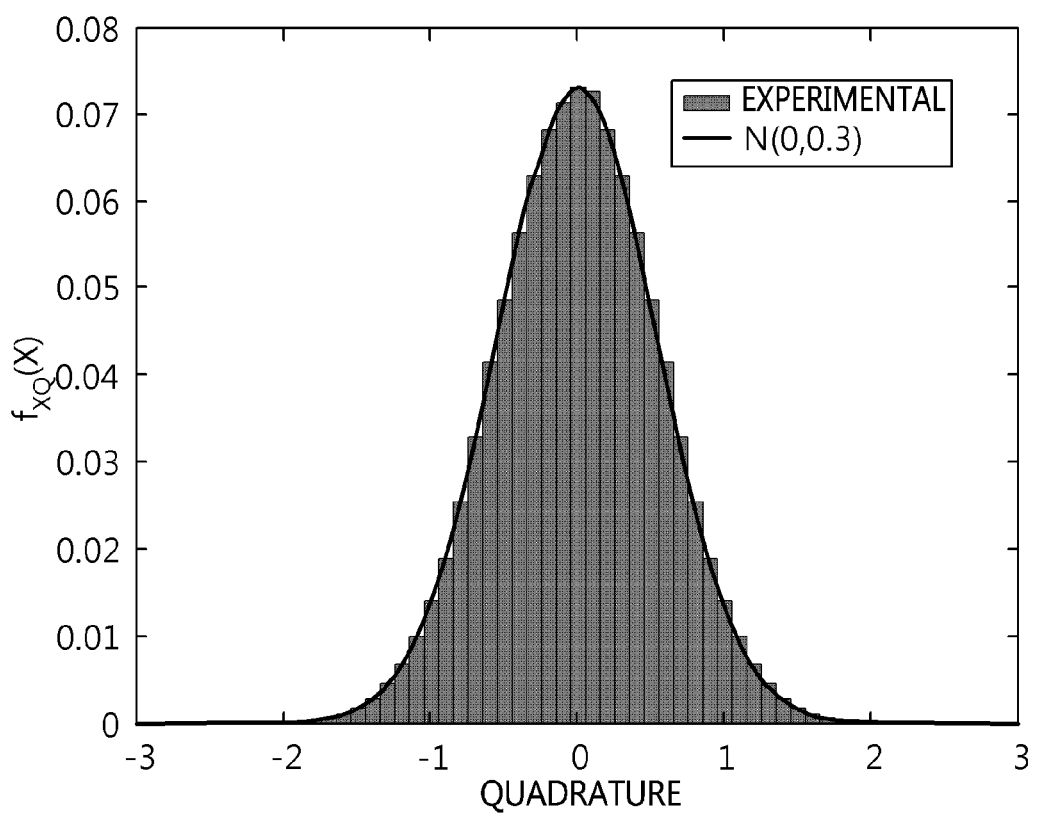

FIGS. 3 and 4 are diagrams illustrating examples of the distribution of I/Q data signals.

FIG. 3 is a diagram illustrating the distribution of an In-phase (I) data signal, and FIG. 4 is a diagram illustrating the distribution of a Quadrature (Q) data signal.

Referring to FIGS. 3 and 4, a normal noise-free Orthogonal Frequency Divisional Multiplexing (OFDM) baseband signal follows a normal distribution $N(0, \sigma^2)$ having an average of 0 and a variance of $\sigma^2$ by the Central Limit Theorem (CLT). Here, each of the I data and the Q data independently follows the same normal distribution $N(0, \sigma^2/2)$. Normalized power in an Inverse Fast Fourier Transform (IFFT) is represented by the ratio of the number of subcarriers that are actually used to the total number of subcarriers, and is equal to $\sigma^2$.

For example, in the case of a Long-Term Evolution (LTE) signal having a bandwidth of 10 MHz, the total number of subcarriers is 1024, the number of subcarriers that are actually used is 601, and a normalized power value is about 0.6, by which it can be seen that the distribution of the I data and the Q data is N(0, 0.3).

Figure 5:
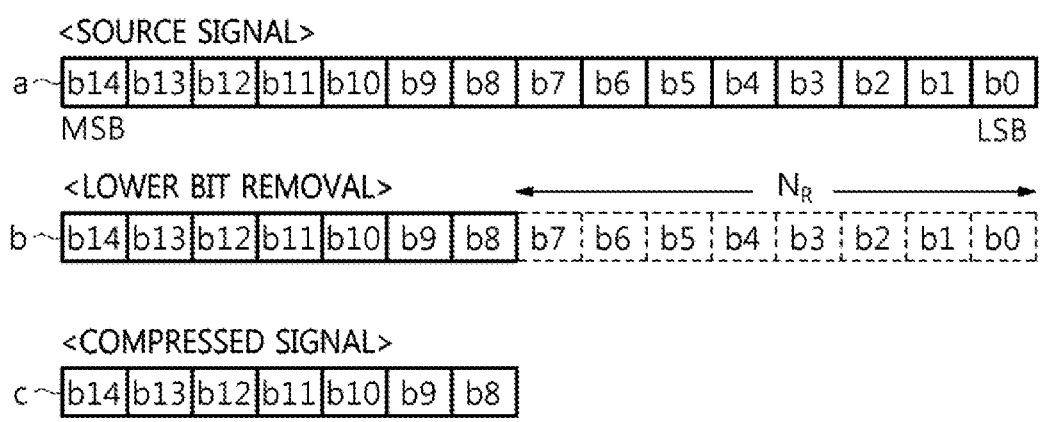
FIG. 5 is a diagram illustrating a change in a data signal depending on a lossy compression method according to an embodiment of the present invention.

FIG. 5 is a diagram illustrating a change in a data signal depending on a lossy compression method according to an embodiment of the present invention.

Referring to FIG. 5, a data compression method according to an embodiment of the present invention removes $N_R$ lower bits from quantized data.

In detail, a source data signal 5a is a bitstream composed of 15 bits, and each of the bits (b0 to b14) has a value of 0 or 1. Among these bits, bit b14 is the Most Significant Bit (MSB) and bit b0 is the Least Significant Bit (LSB). From the given source data signal 5a, 8 ($=N_R$) lower bits may be selected as removal target lower bits, and may be eliminated (5b), and thus a compressed data signal 5c is generated. That is, bits b0 to b7 are removed from the lower bits, and only bits b8 to b14 remain in the data signal, and then the data signal is lossily compressed.

Information about the removal target lower bits may be lost while the lossily compressed data signal is subsequently recovered, and thus an error may occur between a decompressed data signal and the source data signal, and may be defined as the error vector magnitude expressed in the following Equation (1):

$$EVM = \sqrt{\frac{E[|x - \bar{x}|^2]}{E[|x|^2]}} \quad (1)$$

In Equation (1), x and $\bar{x}$ each denote a complex number composed of I data and Q data, where x denotes a source data signal and $\bar{x}$ denotes a decompressed data signal. The error vector magnitude may be calculated only when the decompressed data signal is compared with the source data signal depending on the definition thereof. However, as will be described later, the present invention may calculate the error vector magnitude before compression and decompression are performed using the distribution characteristics of data signals.

In particular, the source data signal and the decompressed data signal have the same bitstreams except for the removal target lower bits, and thus only bitstreams corresponding to the removal target lower bits need to be compared with each other. Therefore, it is assumed that, for convenience of description, a bitstream corresponding to the removal target lower bits for x is z, and a bitstream corresponding to the removal target lower bits for $\bar{x}$ is $\bar{z}$. During the procedure for decompressing the compressed signal, 0 and 1 are randomly inserted into the bits of $\bar{z}$. When a minimum mean square error for z is obtained in order to reduce the error vector magnitude, it may be represented by the following Equations (2) and (3):

$$mmse(\bar{z}) = \min_{\bar{z}} E[|z - \bar{z}|^2] = \min_{\bar{z}_I} E[(z_I - \bar{z}_I)^2] + j \min_{\bar{z}_Q} E[(z_Q - \bar{z}_Q)^2] \quad (2)$$

$$mmse(\bar{z}) = \min_{\bar{z}_I}\{E[z_I^2] - 2E[z_I]\bar{z}_I + \bar{z}_I^2\} + j \min_{\bar{z}_Q}\{E[z_Q^2] - 2E[z_Q]\bar{z}_Q + \bar{z}_Q^2\} \quad (3)$$

Based on the following Equations (4) and (5), when the minimum mean square error is partially differentiated with respect to $\bar{z}_I$ and $\bar{z}_Q$, and an optimal value for causing the partially differentiated result to be 0 is obtained, the following Equation (6) is given.

$$\frac{\partial mmse(\bar{z})}{\partial \bar{z}_I} = -2(E[z_I] - \bar{z}_I) = 0 \quad (4)$$

$$\frac{\partial mmse(\bar{z})}{\partial \bar{z}_Q} = -2j(E[z_Q] - \bar{z}_Q) = 0 \quad (5)$$

$$\bar{z}_{opt} = \bar{z}_I + j\bar{z}_Q = E[z_I] + jE[z_Q] \quad (6)$$

That is, in order to minimize the error vector magnitude during a decompression procedure, the bitstream corresponding to the removal target lower bits needs only to be decompressed into $\bar{z}_{opt}$, and $\bar{z}_{opt}$ may be the expected value or the average of the removal target lower bits.

Figure 6:
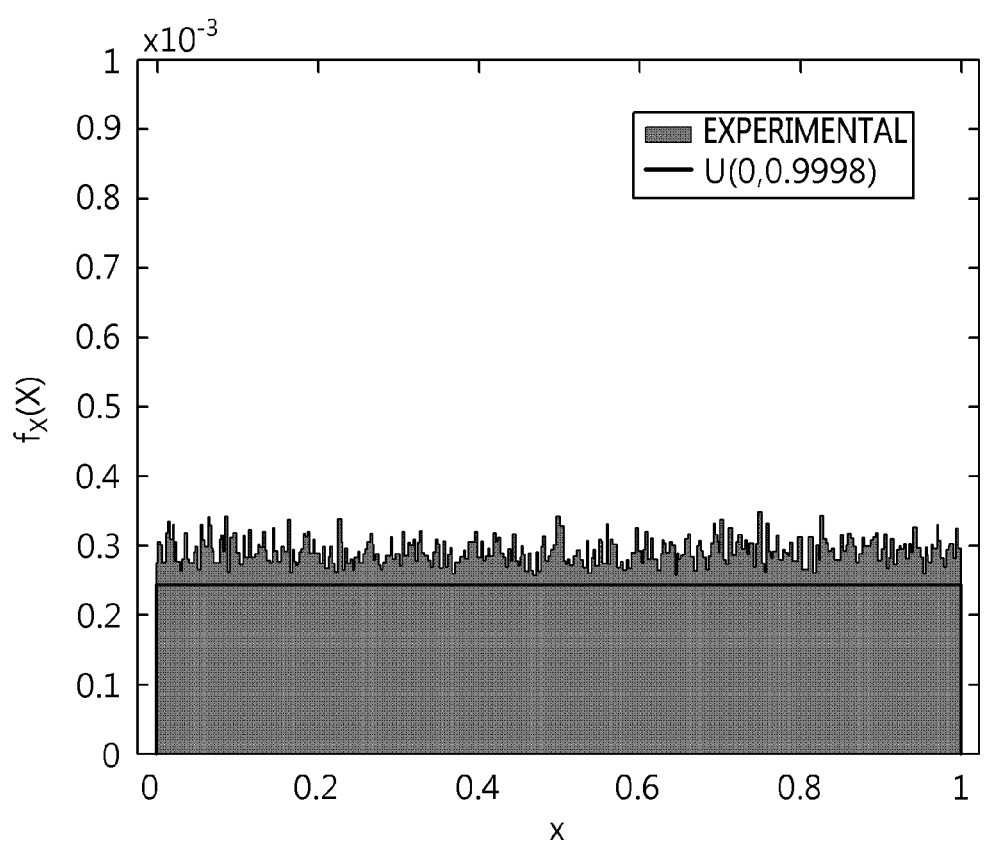
FIG. 6 is a diagram illustrating an example of the distribution of removal target lower bits in lossy compression according to an embodiment of the present invention.

FIG. 6 is a diagram illustrating an example of the distribution of removal target lower bits in lossy compression according to an embodiment of the present invention.

From a signal represented by fixed-point data Q(m, n), $N_R$ removal target lower bits follow a uniform distribution U(0, β), where β can be calculated using the following Equation (7):

$$\beta = 2^{(N_R-n)} - 2^{-n} \quad (7)$$

Referring to FIG. 6, the distribution of removal target lower bits, obtained when 12 lower bits are removed from an I/Q data signal represented by fixed-point data Q(2,12), is slightly different from a theoretical uniform distribution, but it can be determined that experimentally obtained values have the characteristics of the uniform distribution. That is, it may be considered that the removal target lower bits follow the uniform distribution. That is, $\bar{z}_{opt}$ in Equation (7) may mean that an MSB is 1 and the remaining bits are populated with 0. Accordingly, when decompression is performed after data has been lossily compressed, the MSB of the removal target lower bits is decompressed into 1 and the remaining bits thereof are decompressed into 0, and thus the error vector size may be minimized.

That is, when the I data and the Q data of the source data signal follow a normal distribution N(0, σ²/2) and the removal target lower bits follow a uniform distribution U(0, β), the error vector magnitude of the decompressed data signal may be calculated using the following Equation (8) before the compression and decompression of the data signal are performed.

$$EVM = \sqrt{\frac{E[|z - \bar{z}_{opt}|^2]}{E[|x|^2]}} = \sqrt{\frac{2(E[z_I^2] - E[z_I]^2)}{E[|x|^2]}} = \sqrt{\frac{2\mathrm{Var}(z_I)}{E[|x|^2]}} = \sqrt{\frac{\beta^2/6}{E[|x|^2]}} \quad (8)$$

In the error vector magnitude in Equation (8), the value of a denominator is the power of the data signal, but the error vector magnitude may be simply calculated as the ratio of the number of subcarriers that are used to the total number of subcarriers in a noise-free Long-Term Evolution (LTE) downstream signal that is transferred from a data processing unit, that is, a Digital Unit (DU), to a radio transmission/reception unit, that is, a Radio Unit (RU), in an LTE system having a Cloud-Radio Access Network (C-RAN) structure.

Figure 7:
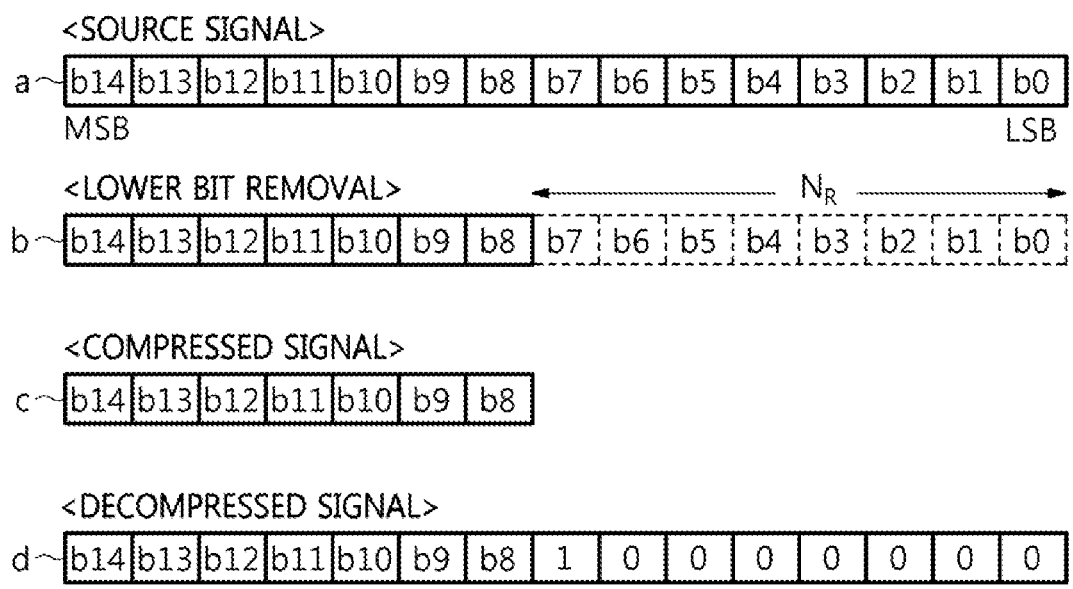
FIG. 7 is a diagram illustrating a change in a data signal depending on a lossy compression and decompression method according to an embodiment of the present invention.

FIG. 7 is a diagram illustrating a change in a data signal depending on a lossy compression and decompression method according to an embodiment of the present invention.

Referring to FIG. 7, a source data signal 7a is a bitstream composed of 15 bits, and each of the bits b0 to b14 has a value of 0 or 1. From the given source data signal 7a, 8 ($=N_R$) lower bits may be selected as removal target lower bits, and may be removed (7b), and thus a compressed data signal 7c is generated. Further, when the compressed data signal 7c is decompressed, it may be decompressed as a decompressed signal 7d in such a way that the MSB of the removal target lower bits is decompressed into 1 and the remaining bits are decompressed into 0.

Figure 8:
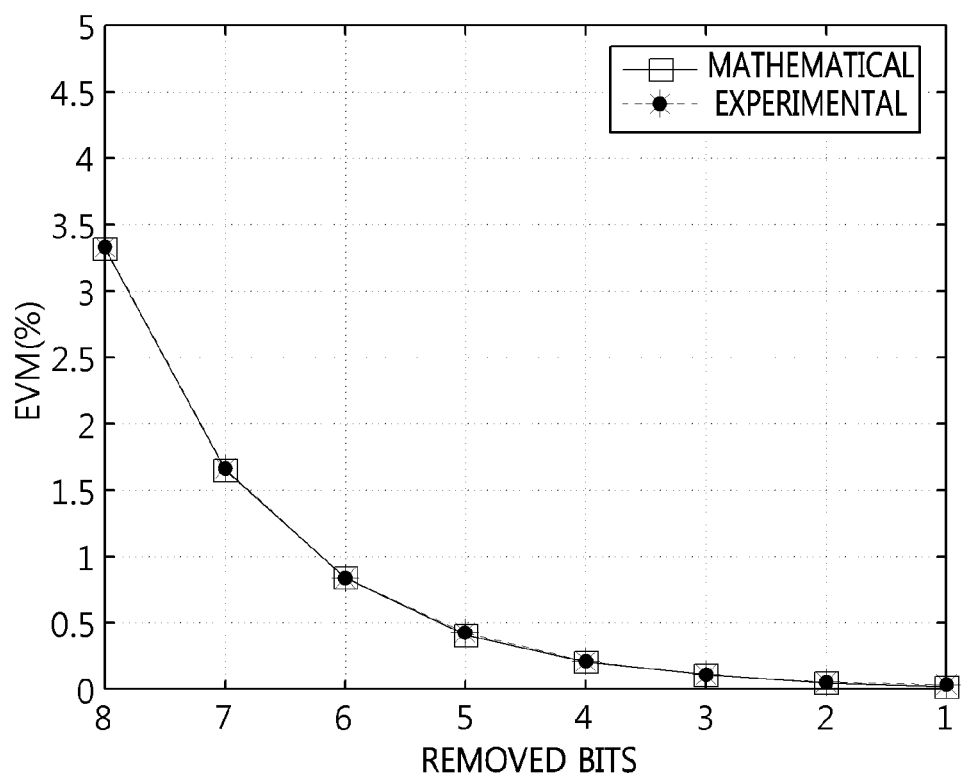
FIG. 8 is a diagram illustrating a comparison between the results of calculation of an error vector magnitude according to an embodiment of the present invention and experimental results.

FIG. 8 is a diagram illustrating a comparison between the results of calculation of an error vector magnitude according to an embodiment of the present invention and experimental results.

In FIG. 8, a data signal for the calculation of an error vector magnitude is fixed-point data Q(2, 12), is an LTE downstream signal having a bandwidth of 10 MHz, has a total of 1024 subcarriers, and uses 601 subcarriers. Here, the power value of the data signal is about 0.6 (=601/1024). The minimized error vector magnitude, which is calculated using Equation (8) and is obtained depending on the number of removal target lower bits, is shown in the following Table 1:

TABLE 1

| Number of removed bits | error vector magnitude |
|---|---|
| 1 | 0.00031 |
| 2 | 0.00055 |
| 3 | 0.00105 |
| 4 | 0.00209 |
| 5 | 0.00416 |
| 6 | 0.00833 |
| 7 | 0.01664 |
| 8 | 0.03336 |

TABLE 1-continued

| Number of removed bits | error vector magnitude |
|---|---|
| 9 | 0.06654 |
| 10 | 0.13345 |
| 11 | 0.26653 |

In particular, the number of removal target lower bits may be obtained by the following Equations (9) to (12), and may be used as a parameter for data compression.

$$N_R = \underset{0 \leq N_R \leq Q_o}{\operatorname{argmax}} \sqrt{\frac{\beta^2}{6E[|x|^2]}} \text{ s.t. } \sqrt{\frac{\beta^2}{6E[|x|^2]}} < V_E \quad (9)$$

$$N_R = \underset{0 \leq N_R \leq Q_o}{\operatorname{argmax}} \frac{2^{-n}(2^{N_R}-1)}{\sqrt{6} \cdot \sqrt{E[|x|^2]}} \text{ s.t. } \frac{2^{-n}(2^{N_R}-1)}{\sqrt{6} \cdot \sqrt{E[|x|^2]}} < V_E \quad (10)$$

$$N_R = \underset{0 \leq N_R \leq Q_o}{\operatorname{argmax}} 2^{N_R} \text{ s.t. } 2^{N_R} < \frac{\sqrt{6} \cdot \sqrt{E[|x|^2]} \cdot V_E}{2^{-n}} + 1 \quad (11)$$

$$N_R = \underset{0 \leq N_R \leq Q_o}{\operatorname{argmax}} N_R \text{ s.t. } N_R < \log_2\left(\frac{\sqrt{6} \cdot \sqrt{E[|x|^2]} \cdot V_E}{2^{-n}} + 1\right) \quad (12)$$

In Equations (9) to (12), $N_R$ denotes an integer value indicating the number of removal target lower bits, and $V_E$ denotes a given error vector magnitude. That is, the number of removal target lower bits that provide maximum compressibility can be set within the range of the given error vector magnitude.

Referring to FIG. 8, it can be seen that error vector magnitudes calculated based on Equation (8) and experimentally obtained error vector magnitudes are equal to each other. Therefore, in order to obtain error vector magnitudes of less than 0.02 (2%) and maximum compressibility from the calculation of error vector magnitudes, a maximum of 7 bits may be removed from the lower bits. In this way, through the use of the distribution characteristics of the data signal and the distribution characteristics of the removal target lower bits, even before the data signal is compressed and decompressed, the error vector magnitudes may be calculated depending on the decompression method for minimizing the error vector magnitudes. Further, removal target lower bits which provide maximum compressibility while satisfying a given error vector magnitude requirement may be set.

Furthermore, the data compression method according to the embodiment of the present invention may additionally perform lossless compression as well as lossy compression. As the lossless compression method, Huffman coding, which causes a more frequently appearing bitstream to match a shorter bitstream and a less frequently appearing bitstream to match a longer bitstream depending on the frequency of bitstreams, may be used.

Huffman coding is source coding that is capable of compressing data without requiring additional bits and has been used in many fields. In the conventional technology, source coding has been applied to all bits representing I/Q data samples. However, as noted above, a problem may arise in that, since lower bits have a uniform distribution, compression efficiency is deteriorated, and in that when the number of bits representing each sample is increased, complexity is increased. Also, when I/Q data is analyzed for each bit, sign extension bits have consecutive values of 0 or 1. Due to this, when Huffman coding is applied only to a portion of the upper bits of the data signal in which such sign extension bits are present, complexity may be decreased and compression efficiency may be improved compared to the case where Huffman coding is applied to the entire sample.

In accordance with the present invention, assuming that the number of bits representing a data signal compressed by removing the lower bits of the data signal is $Q_C$, the number of bits to which Huffman coding is applied is $Q_{PM}$, and the number of bits to which Huffman coding is not applied is $Q_{PL}$, $Q_C$ may be represented by the sum of $Q_{PM}$ and $Q_{PL}$. For example, the following Table 2 shows Huffman coding parameters when the number of target upper bits $Q_{PM}$ for lossless compression is 4.

TABLE 2

| i | Code |
|---|---|
| 0(0000) | 00 |
| 1(0001) | 100 |
| 2(0010) | 1011 |
| 3(0011) | 1010100 |
| 4(0100) | 101010110 |
| 5(0101) | 10101011111111 |
| 6(0110) | 10101011111110 |
| 7(0111) | 1010101111110 |
| 8(1000) | 101010111110 |
| 9(1001) | 1010101110 |
| 10(1010) | 1010101110 |
| 11(1011) | 10101010 |
| 12(1100) | 101011 |
| 13(1101) | 10100 |
| 14(1110) | 11 |
| 15(1111) | 01 |

Referring to Table 2, as the number of times that the same number from an MSB is repeated in the target upper bits for lossless compression is greater, the converted bitstream becomes shorter. Therefore, since the sign extension bits are characterized in that 0 or 1 is repeated, Huffman coding is applied only to some upper bits of the data signal, thus enabling the data signal to be effectively compressed without loss.

That is, the I/Q data compression method according to the embodiment of the present invention may compress data by combining lossy compression with lossless compression. Through the calculation of the error vector magnitude, lossy compression for minimizing the amount of loss depending on compression may be performed, and partial lossless compression may be performed on a repeated bitstream, thus enabling compression efficiency to be improved while an error from source data is minimized. Here, lossy compression is a scheme for calculating an error vector magnitude and suitably removing lower bits of a data signal represented by individual bits, and lossless compression is a scheme for compressing only a portion in which sign bits are extended, among the bits of the data signal compressed through lossy compression, by applying source coding, such as Huffman coding, to the portion.

Figure 9:
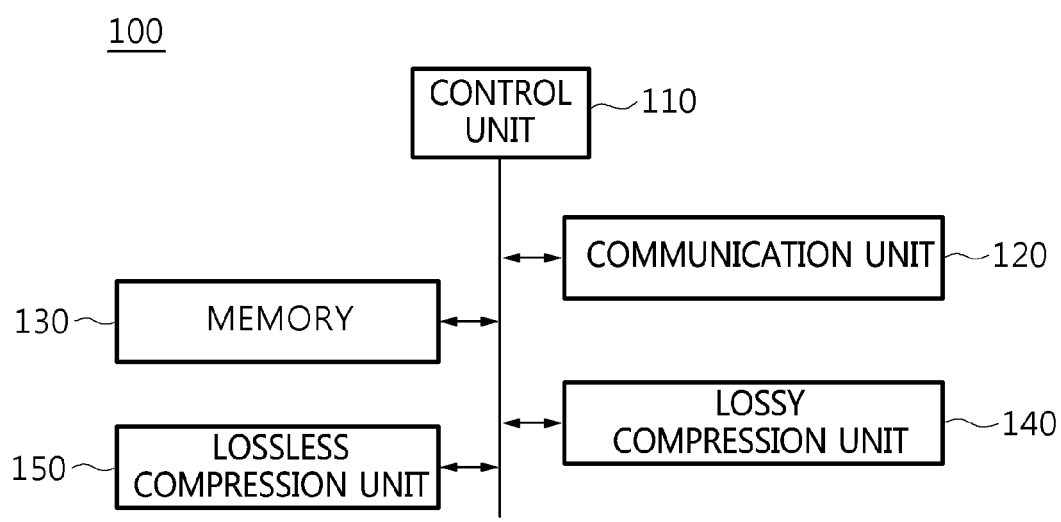
FIG. 9 is a block diagram illustrating an example of the data compression apparatus of FIG. 1.

FIG. 9 is a block diagram illustrating an example of the data compression apparatus 100 illustrated in FIG. 1.

Referring to FIG. 9, the data compression apparatus 100 according to the embodiment of the present invention includes a control unit 110, a communication unit 120, memory 130, a lossy compression unit 140, and a lossless compression unit 150.

In detail, the control unit 110, which is a kind of Central Processing Unit (CPU), controls the overall process of data compression. That is, the control unit 110 may provide various functions by controlling the communication unit 120, the memory 130, the lossy compression unit 140, and the lossless compression unit 150.

Here, the control unit 110 may include all types of devices capable of processing data, such as a processor. Here, the term "processor" may refer to a data-processing device that has a physically structured circuit to perform functions represented by code or instructions included in a program and that is embedded in hardware. In this way, examples of the data-processing device embedded in hardware may include, but are not limited to, processing devices such as a microprocessor, a CPU, a processor core, a multiprocessor, an Application-Specific Integrated Circuit (ASIC), and a Field-Programmable Gate Array (FPGA).

The communication unit 120 provides a communication interface required for the transfer of transmission/reception signals between the data compression apparatus 100, the data decompression apparatus 200, and the data processing device 300.

Here, the communication unit 120 may be a device including hardware and software required in order to transmit/receive signals, such as control signals or data signals, to/from other network devices through wired/wireless connection.

The memory 130 functions to temporarily or permanently store data processed by the control unit 110. Here, the memory 130 may include, but is not limited to, magnetic storage media or flash storage media.

The lossy compression unit 140 calculates, in advance, an error vector magnitude depending on data compression and decompression for a compression target data signal, sets removal target lower bits which satisfy a given error vector magnitude requirement using the error vector magnitude calculated in advance, and then lossily compresses the compression target data signal.

Here, the lossy compression unit 140 may calculate the error vector magnitude using one or more of the distribution characteristics of the compression target data signal and the distribution characteristics of the removal target lower bits of the compression target data signal.

Here, the lossy compression unit 140 may determine a lossy decompression method for minimizing the error vector magnitude using the distribution characteristics, and may calculate the minimized error vector magnitude by comparing the data signal to be decompressed based on the determined lossy decompression method with the compression target data signal. For example, the removal target lower bits may be considered to follow a uniform distribution, and then a lossy decompression method, in which, among the removal target lower bits, an MSB is decompressed into 1 and the remaining bits are decompressed into 0, may be determined.

Here, the lossy compression unit 140 may calculate a minimized error vector magnitude for each of the numbers of removal target lower bits, and may set the maximum number of bits corresponding to the removal target lower bits that satisfy the given error vector magnitude requirement. For example, assuming that, when the number of removal target lower bits is 6, the error vector magnitude is calculated as 0.00833, and when the number of removal target lower bits is 7, the error vector magnitude is calculated as 0.01664, and that the error vector magnitude to be satisfied is 0.015, 6, which is the largest number of bits while having an error vector magnitude smaller than 0.015, may be set as the number of removal target lower bits.

The lossless compression unit 150 sets target upper bits for lossless compression for the compression target data signal or the lossily compressed data signal and performs lossless compression on the target upper bits for lossless compression.

Here, the lossless compression unit 150 may perform lossless compression on the target upper bits for lossless compression based on Huffman coding. Here, when lossless compression is performed based on Huffman coding, as the number of times that the same bit from the MSB is repeated is larger, a Huffman coding parameter matching a shorter bitstream may be used.

Here, the lossless compression unit 150 may set the number of target upper bits for lossless compression to a value that is less than or equal to the number of bits of the lossily compressed data signal. Further, the number of target upper bits for lossless compression may be randomly set, or may be set based on the power value of the data signal. For example, when the power value of the data signal is high, the number of target upper bits for lossless compression may be set to a small value, whereas when the power value of the data signal is low, the number of target upper bits for lossless compression may be set to a large value.

Figure 10:
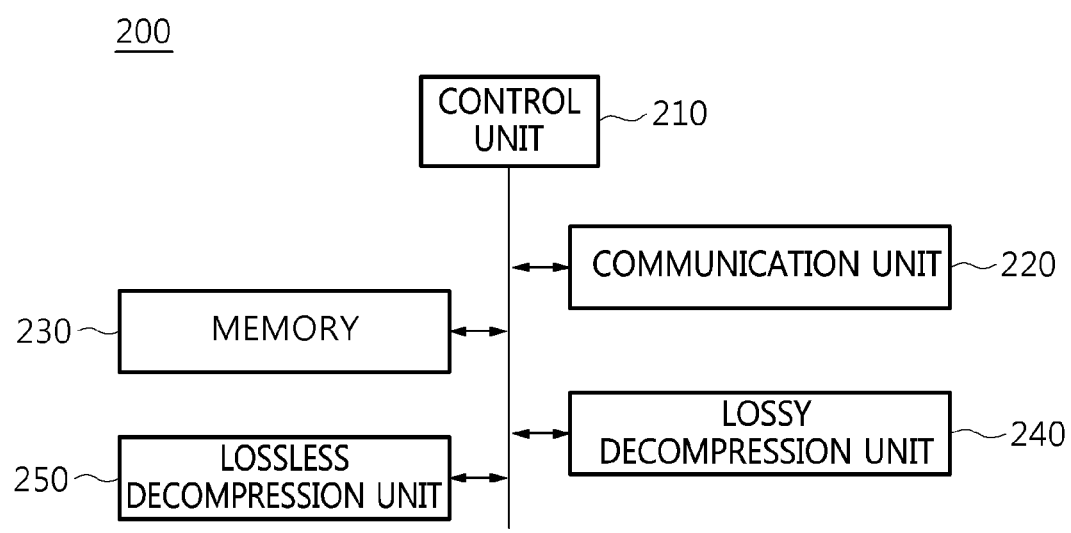
FIG. 10 is a block diagram illustrating an example of the data decompression apparatus of FIG. 1.

FIG. 10 is a block diagram illustrating an example of the data-decompression apparatus 200 illustrated in FIG. 1.

Referring to FIG. 10, the data compression apparatus 200 according to the embodiment of the present invention includes a control unit 210, a communication unit 220, memory 230, a lossy decompression unit 240, and a lossless decompression unit 250.

In detail, the control unit 210, which is a kind of CPU, controls the overall process of data decompression. That is, the control unit 210 may provide various functions by controlling the communication unit 220, the memory 230, the lossy decompression unit 240, and the lossless decompression unit 250.

Here, the control unit 210 may include all types of devices capable of processing data, such as a processor. Here, the term "processor" may refer to a data-processing device that has a physically structured circuit to perform functions represented by code or instructions included in a program and that is embedded in hardware. In this way, examples of the data-processing device embedded in hardware may include, but are not limited to, processing devices such as a microprocessor, a CPU, a processor core, a multiprocessor, an Application-Specific Integrated Circuit (ASIC), and a Field-Programmable Gate Array (FPGA).

The communication unit 220 provides a communication interface required for the transfer of transmission/reception signals between the data-decompression apparatus 200, the data-compression apparatus 100, and the data processing device 300.

Here, the communication unit 220 may be a device including hardware and software required in order to transmit/receive signals, such as control signals or data signals, to/from other network devices through wired/wireless connection.

The memory 230 functions to temporarily or permanently store data processed by the control unit 210. Here, the memory 230 may include, but is not limited to, magnetic storage media or flash storage media.

The lossy decompression unit 240 lossily decompresses a received compressed data signal by recovering removal target lower bits, which have been removed depending on the lossy compression, with respect to the compressed data signal.

Here, the lossy decompression unit 240 may receive information about the number of removal target lower bits from the received compressed data signal from the data compression apparatus (see 100 of FIG. 1), or may directly set the number of removal target lower bits using calculation.

Here, when the number of removal target lower bits is directly set, the lossy decompression unit 240 may set the number of removal target lower bits using the same method as the data-compression apparatus (see 100 of FIG. 1). That is, the lossy decompression unit 240 may calculate, in advance, an error vector magnitude depending on data compression and decompression on a compression target data signal, and may set the number of bits corresponding to the removal target lower bits that satisfy a given error vector magnitude requirement, using the error vector magnitude calculated in advance. Further, the lossy decompression unit 240 may calculate the error vector magnitude using one or more of the distribution characteristics of the compression target data signal and the distribution characteristics of removal target lower bits of the compression target data signal.

Here, the lossy decompression unit 240 may determine a lossy decompression method for minimizing the error vector magnitude using the distribution characteristics, and may lossily decompress the received compressed data based on the determined lossy decompression method. For example, the removal target lower bits may be considered to follow a uniform distribution, and then a lossy decompression method, in which, among the removal target lower bits, an MSB is decompressed into 1 and the remaining bits are decompressed into 0, may be determined.

Here, when the number of removal target lower bits is directly set, the lossy decompression unit 240 may calculate a minimized error vector magnitude for each of the numbers of removal target lower bits, and may set the maximum number of bits corresponding to the removal target lower bits that satisfy the given error vector magnitude requirement. For example, assuming that, when the number of removal target lower bits is 6, the error vector magnitude is calculated as 0.00833, and when the number of removal target lower bits is 7, the error vector magnitude is calculated as 0.01664, and that the error vector magnitude to be satisfied is 0.015, 6, which is the largest number of bits while having an error vector magnitude smaller than 0.015, may be set as the number of removal target lower bits.

The lossless decompression unit 250 performs lossless decompression on the received compressed data signal.

Here, the lossless decompression unit 250 may perform lossless decompression on the target upper bits for lossless compression based on Huffman coding. Here, when lossless decompression is performed based on Huffman coding, as the number of times that the same bit from the MSB is repeated is larger, a Huffman coding parameter matching a shorter bitstream may be used.

Here, the number of target upper bits for lossless compression may be set to a value that is less than or equal to the number of bits of the lossily compressed data signal. Further, the number of target upper bits for lossless compression may be randomly set, or may be set based on the power value of the data signal. For example, when the power value of the data signal is high, the number of target upper bits for lossless compression may be set to a small value, whereas when the power value of the data signal is low, the number of target upper bits for lossless compression may be set to a large value.

Here, the number of target upper bits for lossless compression may be received from the data compression apparatus (see 100 of FIG. 1).

Figure 11:
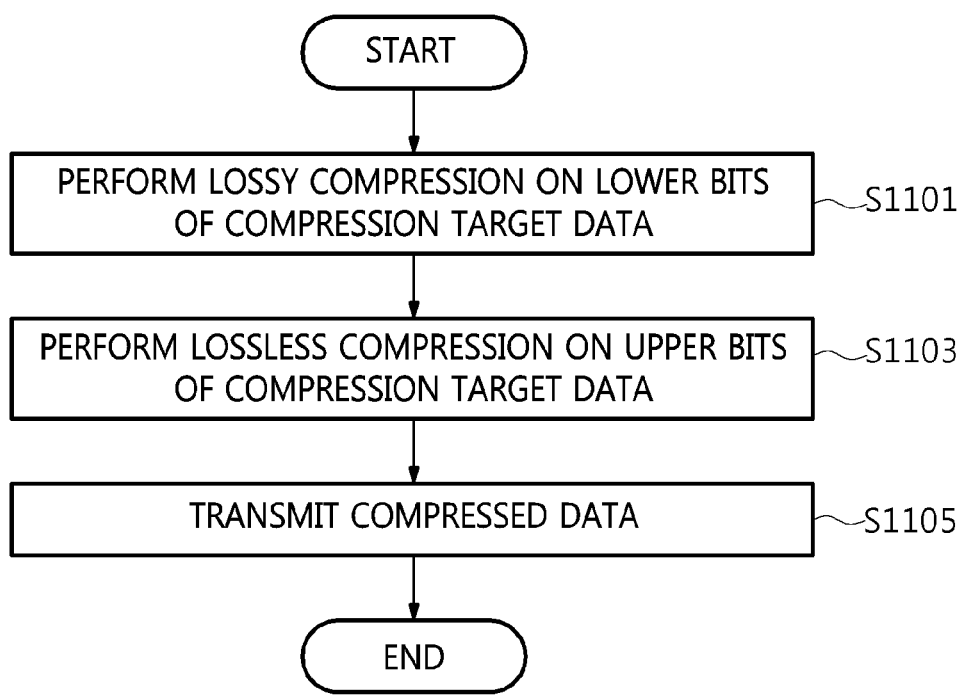
FIG. 11 is an operation flowchart illustrating a data compression method according to an embodiment of the present invention.

FIG. 11 is an operation flowchart illustrating a data compression method according to an embodiment of the present invention.

Referring to FIG. 11, in the data compression method according to the embodiment of the present invention, a data compression apparatus (see 100 of FIG. 1) sets removal target lower bits for a compression target data signal, and performs lossy compression on the compression target data signal at step S1101.

Here, the setting of the removal target lower bits may be performed such that a minimized error vector magnitude is calculated in advance in consideration of the distribution characteristics of the data signal and the distribution characteristics of the removal target lower bits of the data signal, and the removal target lower bits, which satisfy a given error vector magnitude requirement, may be set using the error vector magnitude calculated in advance.

Further, in the data compression method according to the embodiment of the present invention, the data compression apparatus (see 100 of FIG. 1) sets target upper bits for lossless compression for a compression target data signal or a lossily compressed data signal, and performs lossless compression on the target upper bits for lossless compression at step S1103.

Here, lossless compression may be performed on the target upper bits for lossless compression based on Huffman coding.

Next, in the data compression method according to the embodiment of the present invention, the data compression apparatus (see 100 of FIG. 1) transmits the compressed data signal, which has been subjected to lossy compression and lossless compression, to the data decompression apparatus (see 200 of FIG. 1) at step S1105.

Here, information about the number of removal target lower bits or information about the number of target upper bits for lossless compression, together with the compressed data signal, may be transmitted to the data decompression apparatus (see 200 of FIG. 1).

Accordingly, lossy compression for providing the maximum compressibility while satisfying the given error vector magnitude may be performed at the same time that Huffman coding is applied only to a portion of upper bits in which sign extension bits are present, thus enabling efficient data compression to be performed from the standpoint of complexity and compressibility.

In a selective embodiment, among steps S1101, S1103, and S1105, step S1101 of performing lossy compression and step S1103 of performing lossless compression may be performed in parallel.

In a selective embodiment, among steps S1101, S1103, and S1105, step S1103 of performing lossless compression may be performed first, and step S1101 of performing lossy compression may be subsequently performed.

Figure 12:
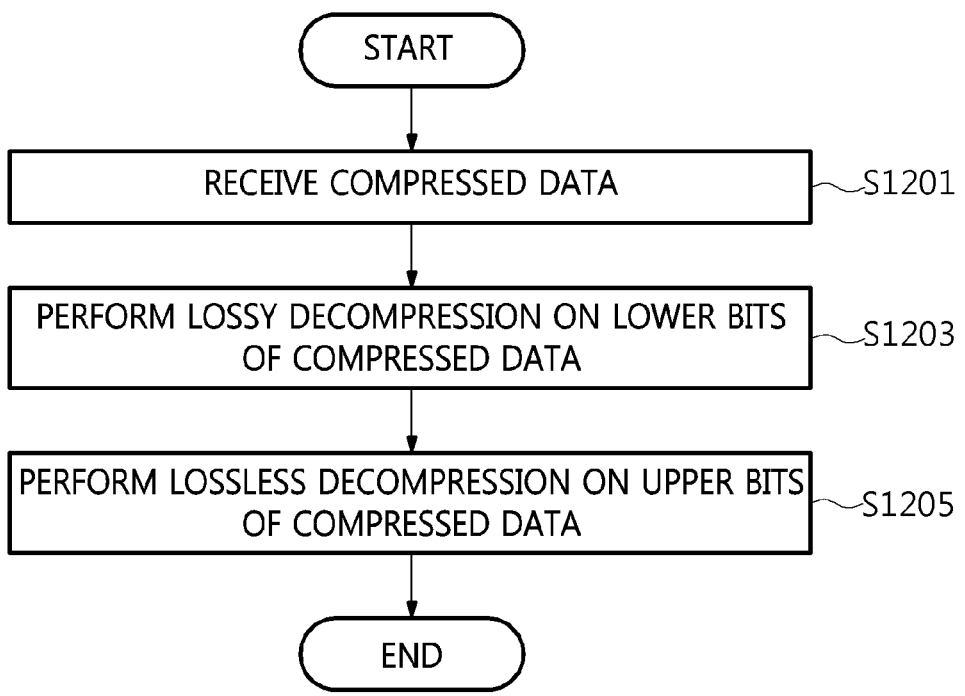
FIG. 12 is an operation flowchart illustrating a data decompression method according to an embodiment of the present invention.

FIG. 12 is an operation flowchart illustrating a data decompression method according to an embodiment of the present invention.

Referring to FIG. 12, in the data decompression method according to the embodiment of the present invention, a data decompression apparatus (see 200 of FIG. 1) receives a compressed data signal from a data compression apparatus (see 100 of FIG. 1) at step S1201.

Here, information about the number of removal target lower bits corresponding to the compressed data signal or information about the number of target upper bits for lossless compression may be received together with the compressed data signal. Alternatively, before the compressed data signal is received, information about the number of removal target lower bits corresponding to the compressed data signal or information about the number of target upper bits for lossless compression may be received in advance.

Next, in the data decompression method according to the embodiment of the present invention, the data decompression apparatus (see 200 of FIG. 1) performs lossy decompression on the received compressed data signal by recovering removal target lower bits with respect to the decompressed data signal at step S1203.

Here, among the removal target lower bits, an MSB may be decompressed into 1, and the remaining bits may be decompressed into 0.

Further, in the data decompression method according to the embodiment of the present invention, the data decompression apparatus (see 200 of FIG. 1) performs lossless decompression on the compressed data signal or a lossily decompressed data signal at step S1205.

In this case, the same Huffman coding may be applied to on bitstreams, into which target upper bits for lossless compression are converted based on Huffman coding, thus enabling lossless decompression to be realized.

In a selective embodiment, among steps S1201, S1203, and S1205, step S1203 of performing lossy decompression and step S1205 of performing lossless decompression may be performed in parallel.

In a selective embodiment, among steps S1201, S1203, and S1205, step S1205 of performing lossless decompression may be performed first, and step S1203 of performing lossy decompression may be subsequently performed at step S1203.

Figure 13:
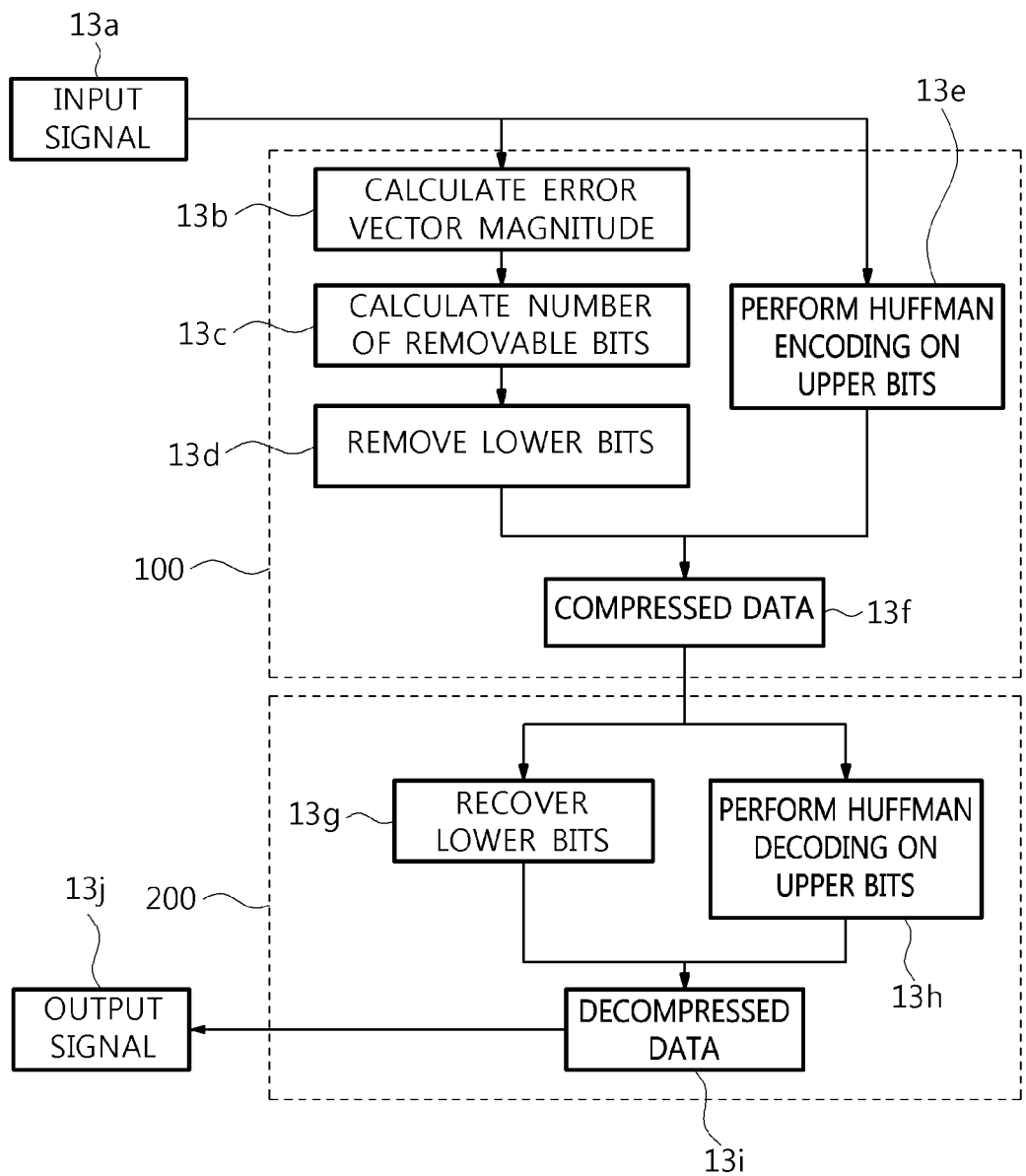
FIG. 13 is a diagram illustrating a data compression and decompression process according to an embodiment of the present invention.

FIG. 13 is a diagram illustrating a data compression and decompression process according to an embodiment of the present invention.

Referring to FIG. 13, an input signal 13a is input to a data compression apparatus 100. The data compression apparatus 100 calculates an error vector magnitude corresponding to the input signal 13a (13b), calculates the number of removable bits from the error vector magnitude to set removal target lower bits (13c), and removes the set removal target lower bits (13d). Next, the data compression apparatus 100 sets target upper bits for lossless compression for the input signal 13a, and performs Huffman encoding on the upper bits (13e). Compressed data 13f is generated through lossy compression on the lower bits and lossless compression on the upper bits, and is then transmitted to the data decompression apparatus 200.

The data decompression apparatus 200 recovers the removal target lower bits with respect to the compressed data 13f (13g) and performs Huffman decoding on the upper bits (13h). Decompressed data 13i is generated through lossy decompression performed on the lower bits and lossless decompression performed on the upper bits, and is then output as an output signal 13j.

Figure 14:
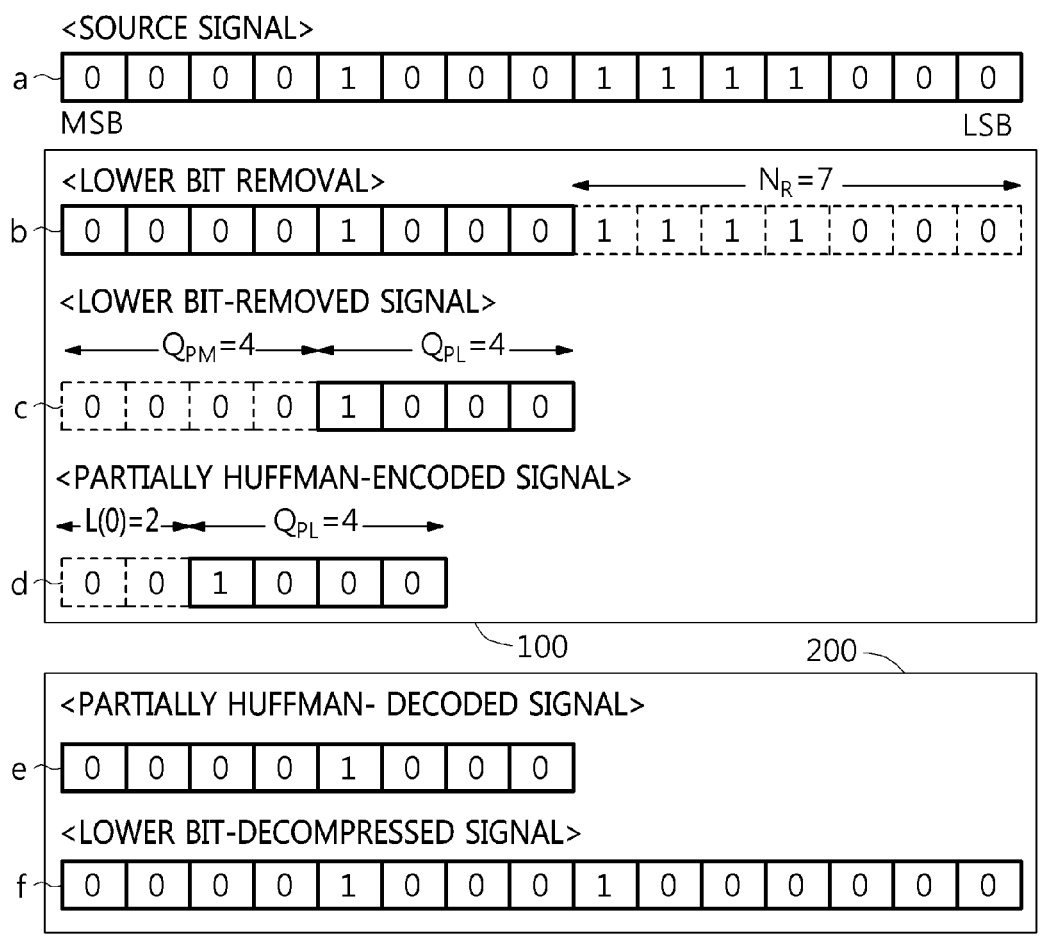
FIG. 14 is a diagram illustrating a change in a data signal depending on a data compression and decompression method according to an embodiment of the present invention.

FIG. 14 is a diagram illustrating a change in a data signal depending on the data compression and decompression method according to an embodiment of the present invention.

Referring to FIG. 14, a source data signal 14a is a bitstream composed of 15 bits, and each of bits b0 to b14 has a value of 0 or 1.

The data compression apparatus 100 may select 7 ($=N_R$) lower bits from a given source data signal 14a as removal target lower bits, and may remove the 7 lower bits (14b), and thus a lossily compressed data signal 14c is generated. Further, the size of Huffman input bits, which is the number of digits of target upper bits for lossless compression, is set to 4 ($=Q_{PM}$) for the lossily compressed data signal 14c, and thus Huffman encoding is performed so as to generate a Huffman-encoded data signal 14d. For example, Huffman encoding may be performed using Huffman coding parameters of Table 2. That is, encoding for converting a bitstream '0000' into '00' may be performed.

Next, the data decompression apparatus 200 performs Huffman decoding on the upper bits of the data 14d compressed by the data compression apparatus 100, and converts '00' into '0000' to generate a losslessly decompressed data signal 14e. Also, lossy decompression may be performed on the losslessly decompressed data signal 14e by decompressing the MSB of the removal target lower bits into 1 and by decompressing the remaining bits into '0', and thus a decompressed data signal 14f is generated.

The above-described embodiments may be implemented as a program that can be executed by various computer means. In this case, the program may be recorded on a computer-readable storage medium. The computer-readable storage medium may include program instructions, data files, and data structures, either solely or in combination. Program instructions recorded on the storage medium may have been specially designed and configured for the present invention, or may be known to or available to those who have ordinary knowledge in the field of computer software. Examples of the computer-readable storage medium include all types of hardware devices specially configured to record and execute program instructions, such as magnetic media, such as a hard disk, a floppy disk, and magnetic tape, optical media, such as Compact Disk Read-Only Memory (CD-ROM) and a Digital Versatile Disk (DVD), magneto-optical media, such as a floptical disk, ROM, Random Access Memory (RAM), and flash memory. Examples of the program instructions include machine language code, such as code created by a compiler, and high-level language code executable by a computer using an interpreter. The hardware devices may be configured to operate as one or more software modules in order to perform the operation of the present invention, and vice versa.

Specific executions, described in the present invention, are only embodiments, and are not intended to limit the scope of the present invention using any methods. For the simplification of the present specification, a description of conventional electronic components, control systems, software, and other functional aspects of systems may be omitted. Further, connections of lines between components shown in the drawings or connecting elements therefor illustratively show functional connections and/or physical or circuit connections. In actual devices, the connections may be represented by replaceable or additional various functional connections, physical connections or circuit connections. Further, unless a definite expression, such as "essential" or "importantly" is specifically used in context, the corresponding component may not be an essential component for the application of the present invention.

In accordance with the present invention, by means of the apparatus and method for data compression and decompression, a minimized error vector magnitude may be calculated using data distribution characteristics, and a data compression and decompression function for providing maximum compressibility while satisfying a given error vector magnitude requirement may be provided.

Further, by means of the apparatus and method for data compression and decompression, lossless data compression is additionally performed on some upper bits of data using the characteristic in which the same bit repeatedly appears in the upper bits of the data, thus providing a data compression and decompression function having low complexity while realizing high compressibility.

As described above, the spirit of the present invention should not be defined by the above-described embodiments, and it will be apparent that the accompanying claims and equivalents thereof are included in the scope of the spirit of the present invention.

What is claimed is:

1. A data compression apparatus, comprising:
a lossy compression unit for calculating, in advance, a reference error vector magnitude depending on lossy compression and decompression by removing lower bits from a data signal composed of bitstreams, for setting removal target lower bits satisfying a preset error vector magnitude requirement, and for lossily compressing the data signal by removing the removal target lower bits from the data signal; and
a communication unit for transmitting the compressed data signal to a data decompression apparatus.

2. The data compression apparatus of claim 1, wherein the reference error vector magnitude is an error vector magnitude calculated based on recovery target lower bits corresponding to the removal target lower bits that minimize the error vector magnitude using one or more of distribution characteristics of the data signal and distribution characteristics of the removal target lower bits.

3. The data compression apparatus of claim 2, wherein the recovery target lower bits are set by assuming that the removal target lower bits are uniformly distributed.

4. The data compression apparatus of claim 3, wherein the recovery target lower bits are set such that a Most Significant Bit (MSB) is populated with 1 and remaining bits are populated with 0.

5. The data compression apparatus of claim 1, further comprising a lossless compression unit for setting target upper bits for lossless compression, among bits of the data signal, and losslessly compressing the target upper bits for lossless compression,
wherein the communication unit transmits the data signal compressed through the lossy compression unit and the lossless compression unit to the data decompression apparatus.

6. The data compression apparatus of claim 5, wherein the lossless compression unit losslessly compresses the target upper bits for lossless compression based on Huffman coding that causes a shorter bitstream to match a bitstream in which an identical bit from an MSB is more frequently repeated.

7. The data compression apparatus of claim 6, wherein the lossless compression unit sets a number of bits corresponding to the target upper bits for lossless compression in consideration of power of the data signal.

8. A data decompression apparatus, comprising:
a communication unit data for receiving a compressed data signal from a data compression apparatus; and
a lossy decompression unit for setting recovery target lower bits corresponding to removal target lower bits that minimize an error vector magnitude using one or more of distribution characteristics of a data signal corresponding to the compressed data signal and distribution characteristics of removal target lower bits corresponding to the compressed data signal, and lossily decompressing the compressed data signal using the set recovery target lower bits.

9. The data decompression apparatus of claim 8, wherein the recovery target lower bits are set by assuming that the removal target lower bits are uniformly distributed.

10. The data decompression apparatus of claim 9, wherein the recovery target lower bits are set such that a Most Significant Bit (MSB) is populated with 1 and remaining bits are populated with 0.

11. The data decompression apparatus of claim 8, further comprising a lossless decompression unit for losslessly decompressing target upper bits for lossless compression, which have been losslessly compressed, using a number of bits corresponding to the target upper bits for lossless compression, among upper bits of the compressed data signal.

12. The data decompression apparatus of claim 11, wherein the lossless decompression unit performs lossless decompression based on Huffman coding that causes a shorter bitstream to match a bitstream in which an identical bit from an MSB is more frequently repeated.

13. The data decompression apparatus of claim 12, wherein the number of bits corresponding to the target upper bits for lossless compression is set based on power of the data signal.

14. A data compression method, comprising:
calculating, in advance, a reference error vector magnitude depending on lossy compression and decompression by removing lower bits from a data signal composed of bitstreams;
setting removal target lower bits satisfying a preset error vector magnitude requirement;
lossily compressing the data signal by removing the removal target lower bits from the data signal; and
transmitting the compressed data signal to a data decompression apparatus.

15. The data compression method of claim 14, wherein the reference error vector magnitude is an error vector magnitude calculated based on recovery target lower bits corresponding to the removal target lower bits that minimize the error vector magnitude using one or more of distribution characteristics of the data signal and distribution characteristics of the removal target lower bits.

16. The data compression method of claim 15, wherein the recovery target lower bits are set by assuming that the removal target lower bits are uniformly distributed.

17. The data compression method of claim 16, wherein the recovery target lower bits are set such that a Most Significant Bit (MSB) is populated with 1 and remaining bits are populated with 0.

18. The data compression method of claim 14, further comprising:
setting target upper bits for lossless compression, among bits of the data signal; and
losslessly compressing the target upper bits for lossless compression,
wherein transmitting the compressed data signal to the data decompression apparatus is configured to transmit the data signal compressed through lossy compression and lossless compression to the data decompression apparatus.

19. The data compression method of claim 18, wherein losslessly compressing is configured to losslessly compress the target upper bits for lossless compression based on Huffman coding that causes a shorter bitstream to match a bitstream in which an identical bit from an MSB is more frequently repeated.

20. The data compression method of claim 19, wherein setting the target upper bits for lossless compression is configured to set a number of bits corresponding to the target upper bits for lossless compression in consideration of power of the data signal.

* * * * *